United States Patent
Pu et al.

(10) Patent No.: US 9,799,942 B2
(45) Date of Patent: Oct. 24, 2017

(54) MULTI-BAND ACTIVE ANTENNA

(71) Applicant: Huawei Technologies Co., Ltd., Shenzhen (CN)

(72) Inventors: Tao Pu, Shanghai (CN); Honggang Xu, Shanghai (CN); Yujiang Wu, Shenzhen (CN); Guopei Li, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 14/866,480

(22) Filed: Sep. 25, 2015

(65) Prior Publication Data

US 2016/0020503 A1    Jan. 21, 2016

Related U.S. Application Data

(63) Continuation of application No. PCT/CN2013/073278, filed on Mar. 27, 2013.

(51) Int. Cl.
*H01Q 21/00* (2006.01)
*H01Q 1/12* (2006.01)
*H04W 88/08* (2009.01)
*H01Q 1/50* (2006.01)
*H01Q 23/00* (2006.01)
*H01Q 1/24* (2006.01)
*H01Q 5/00* (2015.01)
(Continued)

(52) U.S. Cl.
CPC ............ *H01Q 1/12* (2013.01); *H01Q 1/246* (2013.01); *H01Q 1/50* (2013.01); *H01Q 5/00* (2013.01); *H01Q 23/00* (2013.01); *H04W 88/08* (2013.01); *H01L 24/48* (2013.01); *H01L 2224/48137* (2013.01); *H01L 2924/00014* (2013.01); *H01Q 19/185* (2013.01)

(58) Field of Classification Search
USPC ......................................... 343/851, 878, 836
See application file for complete search history.

(56) References Cited

U.S. PATENT DOCUMENTS 8,063,846 B2 * 11/2011 Imaoka ................ H01Q 1/2283
343/851
2011/0032158 A1    2/2011 Rodger et al.
(Continued)

FOREIGN PATENT DOCUMENTS

CN         201550106 U    8/2010
CN         201556711 U    8/2010
(Continued)

*Primary Examiner* — Jessica Han
*Assistant Examiner* — Hai Tran
(74) *Attorney, Agent, or Firm* — Slater Matsil, LLP

(57) ABSTRACT

Embodiments of the present invention provide a multi-band active antenna, including a broadband antenna, a combiner, and an active module, where a concave window is disposed on an enclosure frame of the broadband antenna, and a first port of the broadband antenna is disposed in the window; the combiner is removably connected to the window, and a first port of the combiner is connected to the first port of the broadband antenna; and a mounting kit is disposed on the enclosure frame of the broadband antenna, and the active module is removably connected to the mounting kit and a first port of the active module is connected to a second port of the combiner by a conducting wire.

10 Claims, 5 Drawing Sheets

(51) Int. Cl.
*H01Q 19/185* (2006.01)
*H01L 23/00* (2006.01)

(56) References Cited

U.S. PATENT DOCUMENTS

| | | |
|---|---|---|
| 2012/0206885 A1 | 8/2012 | Pan et al. |
| 2013/0252671 A1 | 9/2013 | Liu et al. |
| 2014/0213322 A1 | 7/2014 | Pu et al. |

FOREIGN PATENT DOCUMENTS

| | | |
|---|---|---|
| CN | 201893434 U | 7/2011 |
| CN | 102509852 A | 6/2012 |
| CN | 102740509 A | 10/2012 |
| CN | 102820893 A | 12/2012 |
| JP | H01155706 A | 6/1989 |
| JP | 2000223924 A | 8/2000 |
| JP | 2004166085 A | 6/2004 |
| JP | 2006339870 A | 12/2006 |
| JP | 2013507854 A | 3/2013 |
| WO | 2012103830 A2 | 8/2012 |
| WO | 2013044847 A1 | 4/2013 |

\* cited by examiner

MULTI-BAND ACTIVE ANTENNA

This application is a continuation of International Application No. PCT/CN2013/073278, filed on Mar. 27, 2013, which is hereby incorporated by reference in its entirety.

TECHNICAL FIELD

The present invention relates to the field of mobile communications, and in particular, to a multi-band active antenna.

BACKGROUND

With the development of mobile communications, there are more application scenarios where multiple frequencies coexist in a base station subsystem. As frequency bands are increasing, the quantity of radio frequency modules and the quantity of antennas at a site are also gradually increased. As a result, the site becomes more crowded, and site deployment and installation become more difficult. Currently, equipment vendors and operators mainly use a scheme that combines a broadband antenna, an external combiner, and an external active module, where the combiner is connected to the external active module by a conducting wire to implement the sharing of an antenna system by multiple frequency bands. In this scheme, unit parts that form a whole antenna are dispersed, and site installation requires large space, making it difficult to perform site installation.

SUMMARY

In view of this, embodiments of the present invention provide a multi-band active antenna, which can reduce site installation space and facilitate site installation.

A first aspect provides a multi-band active antenna, including a broadband antenna, a combiner, and an active module, where a concave window is disposed on an enclosure frame of the broadband antenna, and a first port of the broadband antenna is disposed in the window; the combiner is removably connected to the window, and a first port of the combiner is connected to the first port of the broadband antenna; and a mounting kit is disposed on the enclosure frame of the broadband antenna, the active module is removably connected to the mounting kit and a first port of the active module is connected to a second port of the combiner by a conducting wire.

In a first possible implementation manner of the first aspect, an antenna port of the broadband antenna is also disposed on an external surface of the broadband antenna; the first port of the active module is connected to the antenna port by a conducting wire; and an intermediate port connected to the antenna port is also disposed in the window, where the intermediate port is connected to the second port of the combiner.

In a second possible implementation manner of the first aspect, the active module includes a first active module and a second active module, where the first active module is removably connected to a first mounting kit disposed on the enclosure frame of the broadband antenna, the second active module is removably connected to a second mounting kit disposed on the enclosure frame of the broadband antenna, and a first port of the first active module is connected to the second port of the combiner by a conducting wire; and a first port of the second active module is connected to an antenna port disposed on an external surface of the broadband antenna by a conducting wire, where the antenna port is connected to an intermediate port disposed in the window by a conducting wire, where the intermediate port is connected to a third port of the combiner.

In the foregoing technical solution, because a combiner is removably connected to a window of a broadband antenna and an active module is removably connected to a mounting kit of the broadband antenna, components of a whole multi-band active antenna is integrated into one, thereby reducing occupied site installation space and facilitating site installation.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION OF ILLUSTRATIVE EMBODIMENTS

The following clearly and completely describes the technical solutions in the embodiments of the present invention with reference to the accompanying drawings in the embodiments of the present invention. Apparently, the described embodiments are merely a part rather than all of the embodiments of the present invention. All other embodiments obtained by persons of ordinary skill in the art based on the embodiments of the present invention without creative efforts shall fall in the protection scope of the present invention.

Figure 1:
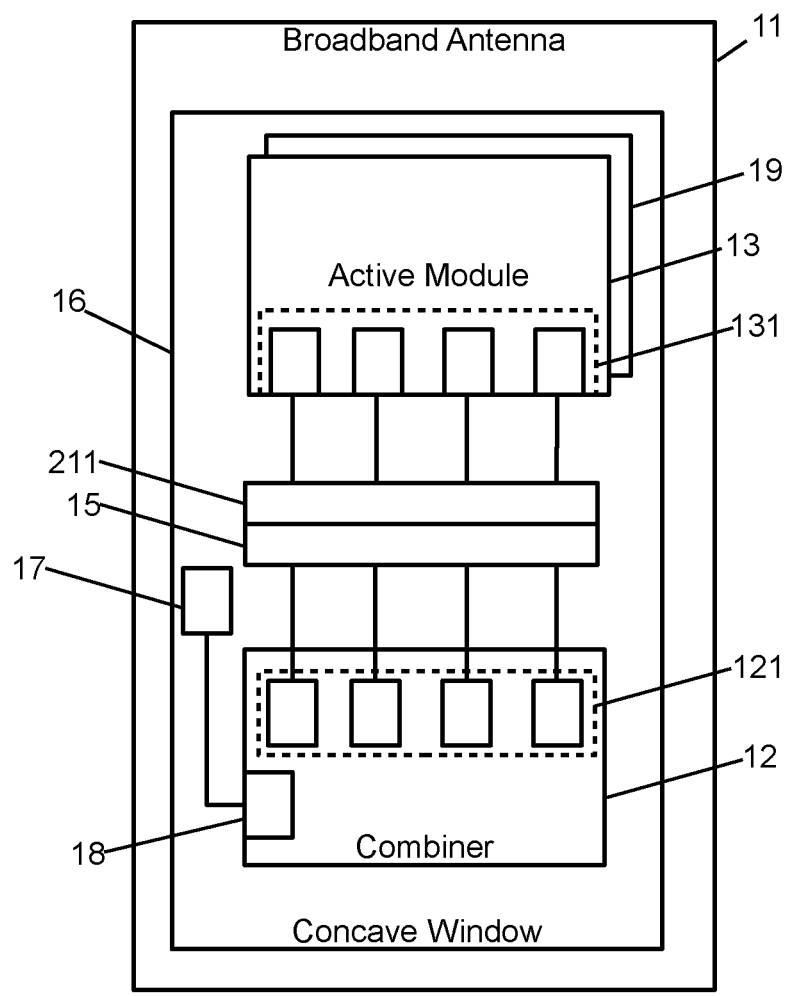
FIG. 1 is a schematic structural diagram of a multi-band active antenna according to an embodiment of the present invention.

FIG. 1 is a schematic structural diagram of a multi-band active antenna according to an embodiment of the present invention. As shown in FIG. 1, the multi-band active antenna includes a broadband antenna 11, a combiner 12, and an active module 13, where a concave window 16 is disposed on an enclosure frame of the broadband antenna 11, and a first port 17 of the broadband antenna 11 is disposed in the window; the combiner 12 is removably connected to the window 16, and a first port 18 of the combiner 11 is connected to the first port 17 of the broadband antenna 11; and a mounting kit 19 is disposed on the enclosure frame of the broadband antenna 11, the active module 13 is removably connected to the mounting kit 19 and a first port 131 of the active module 13 is connected to a second port 121 of the combiner 12 by a conducting wire.

It should be noted that the foregoing ports, for example, the first port 17 of the broadband antenna 11, the first port 18 of the combiner 11, the first port of the active module 132, and the second port 121 of the combiner 11 are bidirectional ports, which means that these ports can be configured to transmit signals and can also be configured to receive signals.

As an optional implementation manner, the active module 13 may be a single active module or multiple active modules. When the active module 13 is multiple active modules, for downlink signals, the active modules 13 amplify signals of multiple frequency bands and then transmit the amplified signals of the multiple frequency bands to the combiner 12, and the combiner 12 synthesizes the signals of the multiple bands and transmits the synthesized signal to the broadband antenna 11; for uplink signals, the broadband antenna 11 receives signals of the multiple frequency bands from user sides and transmits the signals of the multiple frequency bands to the combiner 12, and the combiner 12 splits the signals and transmits the split signals to the active modules 13. In this way, the sharing of an antenna system by multiple frequency bands is implemented.

Optionally, in this embodiment of the present invention, the combiner 12 is removably connected to the window 16 disposed on the broadband antenna 11, and the active module 13 is removably connected to the mounting kit 19 of the broadband antenna 11. In this way, components of a whole multi-band active antenna is integrated, that is, integrated into the broadband antenna 11, so that the size of the multiband active antenna is very small, and the quantity of boxes at a site (for example, base stations) is also very small, thereby reducing occupied site installation space and facilitating site installation.

Optionally, because the combiner 12 and the active module 13 are both removably connected to the broadband antenna 11, frequency band evolution of the antenna can be supported. Therefore, when the broadband antenna 11 undergoes frequency band evolution, for example, when the broadband antenna 11 evolves from a single-band active antenna to a dual-band active antenna, only the combiner 12 needs to be replaced, for example, a direct-through-connected combiner 12 is changed to a 2-in-1 combiner 12, and meanwhile one active module 13 needs to be added on the basis of the original active module 13 installed on the enclosure frame of the broadband antenna 11. In this way, a single-band active antenna can be evolved into a dual-band active antenna. The 2-in-1 combiner 12 updated from the direct-through-connected combiner 12 may be the same as the direct-through-connected combiner 12 in appearance. Similarly, a dual-band active antenna can be evolved into a three-band active antenna, and a three-band active antenna can be evolved into a multi-band active antenna.

Optionally, multiple mounting kits are pre-disposed on the enclosure frame of the broadband antenna 11. In this way, an active module 13 can be added.

Optionally, because the combiner 12 is removably connected to the window 16 of the broadband antenna 11 and the active module 13 is removably connected to the mounting kit of the broadband antenna 11, the combiner 12 and the active module 13 can be maintained independently, that is, the combiner 12 or the active module 13 can be independently removed for maintenance, which can reduce maintenance costs in a process of maintaining a site.

As an optional implementation manner, an antenna port 211 of the broadband antenna 11 is also disposed on an external surface of the broadband antenna 11; the first port 131 of the active module 13 is connected to the antenna port 211 by a conducting wire; and an intermediate port 15 connected to the antenna port is also disposed in the window, where the intermediate port is connected to the second port 121 of the combiner 12.

Optionally, an antenna port 211 may be disposed at a bottom or upper end of the broadband antenna 11.

In this implementation manner, the first port 131 of the active module 13 is connected to the second port 121 of the combiner by the antenna port of the broadband antenna 11.

In the foregoing technical solution, because a combiner is removably connected to a window of a broadband antenna, and an active module is removably connected to a mounting kit of the broadband antenna, components of a whole multi-band active antenna is integrated into the broadband antenna, which can reduce occupied site installation space and facilitate site installation.

Figure 2:
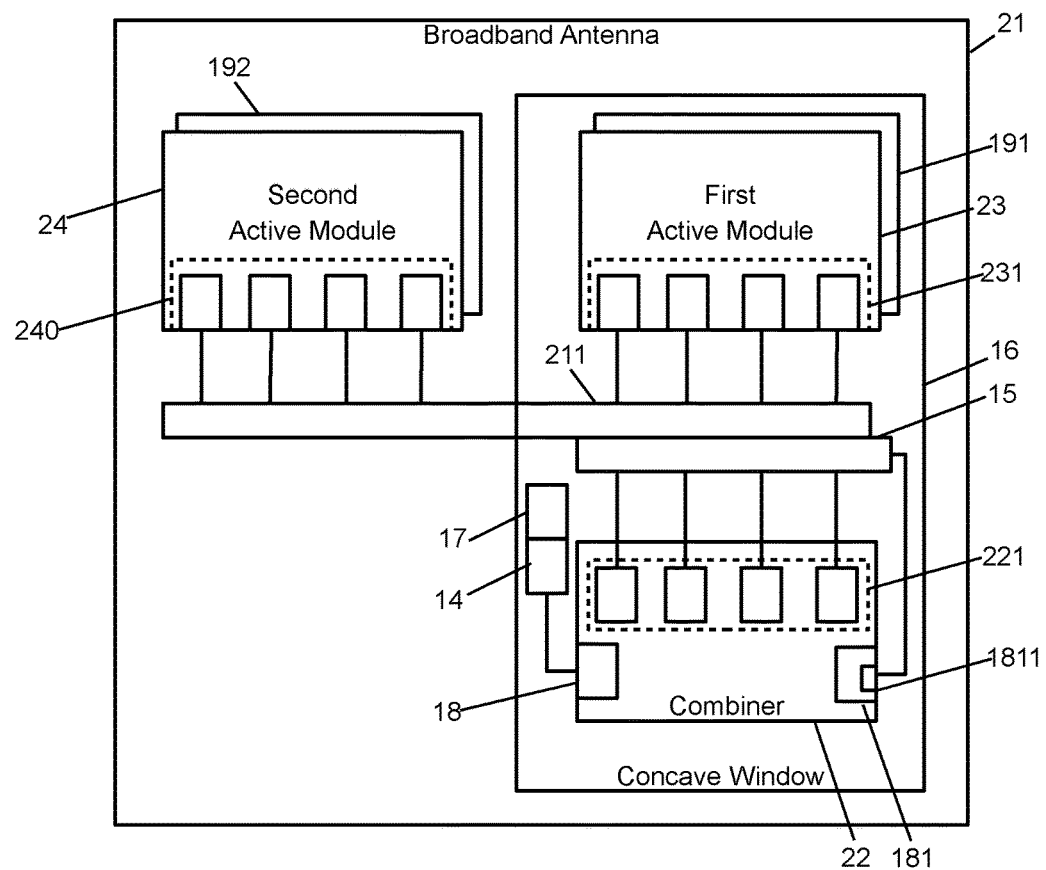
FIG. 2 is a schematic structural diagram of another multi-band active antenna according to an embodiment of the present invention.

FIG. 2 is a schematic structural diagram of another multi-band active antenna according to an embodiment of the present invention. As shown in FIG. 2, the multi-band active antenna includes a broadband antenna 21, a combiner 22, a first active module 23, and a second active module 24, where a concave window 16 is disposed on an enclosure frame of the broadband antenna 21, and an input port of the broadband antenna 21 is disposed in the window; the combiner 22 is removably connected to the window, and a first port 18 of the combiner 22 is connected to a first port 17 of the broadband antenna 21; a first mounting kit 191 and a second mounting kit 192 are disposed on the enclosure frame of the broadband antenna 21, an antenna port 211 is disposed on an external surface of the broadband antenna 21, and an intermediate port 15 is disposed in the window 16 of the broadband antenna 21; the first active module 23 is removably connected to the first mounting kit 191, and the second active module 24 is removably connected to the second mounting kit 192; and a first port 231 of the first active module 23 is connected to a second port 221 of the combiner 22, and a first port 240 of the second active module 24 is connected to the antenna port 211 by a conducting wire, where the antenna port 211 is connected to the intermediate port 15 by a conducting wire, where the intermediate port 15 is connected to a third port 181 of the combiner 22.

Optionally, the first active module 23, the second active module 24, and the combiner 22 are all installed on the broadband antenna 21. In this way, a conducting wire connecting the first active module 23 and the combiner 22 is very short and a conducting wire connecting the second active module 24 and the antenna port 211 is also very short, thereby reducing power consumption caused by the conducting wires.

Optionally, the first mounting kit 191 and the second mounting kit 192 may be disposed on a rear side of the enclosure frame of the broadband antenna 21, where the rear side of the enclosure frame refers to a side on which the window 16 is disposed; and the second port 221 is disposed on a front side of the combiner 22, where the front side of the combiner 22 refers to a side of the combiner 22 located at an opening of the window 16 when the combiner 22 is connected to the window. In this way, the first port 231 of the first active module 23 connected to the first mounting kit 191 is easily connected to the second port 221 of the combiner 22. The antenna port 211 may be disposed on the rear side (for example, at the bottom of the rear side) of the broadband antenna. In this way, the first port 240 of the second active module 24 connected to the second mounting kit can be easily connected to the antenna port 211, where the antenna port 211 may be connected to the intermediate port 15 by a conducting wire inside the broadband antenna 21. The third port 181 and the first port 18 of the combiner 22 may be disposed on the rear side of the combiner 22, where the rear side of the combiner 22 is a side opposite to the front side of the combiner 22. The first port 17 of the broadband antenna 21 may be disposed in a position that is inside the window 16 and matches the first port of the combiner 22, that is, when the combiner 22 is connected to the window 16, the input port 14 of the broadband antenna 21 is located in a position connected to the first port 18 of the combiner 22. In this way, when the combiner 22 is connected to the window 16, the first port 18 of the combiner 22 is connected to the first port 17 of the broadband antenna 21. The intermediate port 15 of the broadband antenna 21 may be disposed in a position that is inside the window and matches the third port 181 of the combiner 22, that is, when the combiner 22 is connected to the window 16, the intermediate port 15 of the broadband antenna 21 is located in a position connected to the third port 181 of the combiner 22. In this way, when the combiner 22 is connected to the window 16, the third port 181 of the combiner 22 is connected to the intermediate port 15 of the broadband antenna 21.

As an optional implementation manner, the first active module 23 may be multiple active modules, the first mounting kit 191 may be multiple mounting kits, and the second port 221 of the combiner 22 may be multiple ports; the second active module 24 may be multiple active modules, the second mounting kit 192 may be multiple mounting kits, the antenna port 211 may be multiple groups of antenna ports, the intermediate port 15 may be multiple intermediate ports, and the third port 181 of the combiner 22 may be multiple ports. The foregoing "first" and "second" may be understood as a first type and a second type. For example, the first active module 23 may be understood as a first type of active module, and the second active module 24 may be a second type of active module. Similarly, the second port 221 may be a first type of port, and the third port 181 may be a second type of port.

Optionally, when the first active module 23 and the second active module 24 are both one active module, the sharing of an antenna system by dual frequency bands is implemented.

For the convenience of description, in this embodiment of the present invention, multiple active modules included in the first active module 23 and multiple active modules included in the second active module 24 are defined as active sub-modules, multiple input ports included in the second port 221 and third port 181 are defined as sub-ports, and multiple mounting kits included in the first mounting kit 191 and second mounting kit 192 may be defined as sub-mounting kits.

Optionally, the second active module 24 includes at least one active sub-module; the second mounting kit 192 disposed on the enclosure frame of the broadband antenna 21 includes at least one sub-mounting kit; the antenna port 211 disposed on the external surface of the broadband antenna 21 includes at least one group of antenna ports; the intermediate port 15 disposed in the window includes at least one intermediate port; and the third port 181 of the combiner 22 includes at least one input sub-port 1811.

Optionally, the at least one active sub-module is installed on the at least one sub-mounting kit in a one-to-one manner; a first port of the at least one active sub-module is connected to the at least one group of antenna ports in a one-to-one manner by a conducting wire; the at least one group of antenna ports is connected to the at least one intermediate port in a one-to-one manner by a conducting wire; and the at least one intermediate port is connected to the at least one input sub-port in a one-to-one manner.

Figure 3:
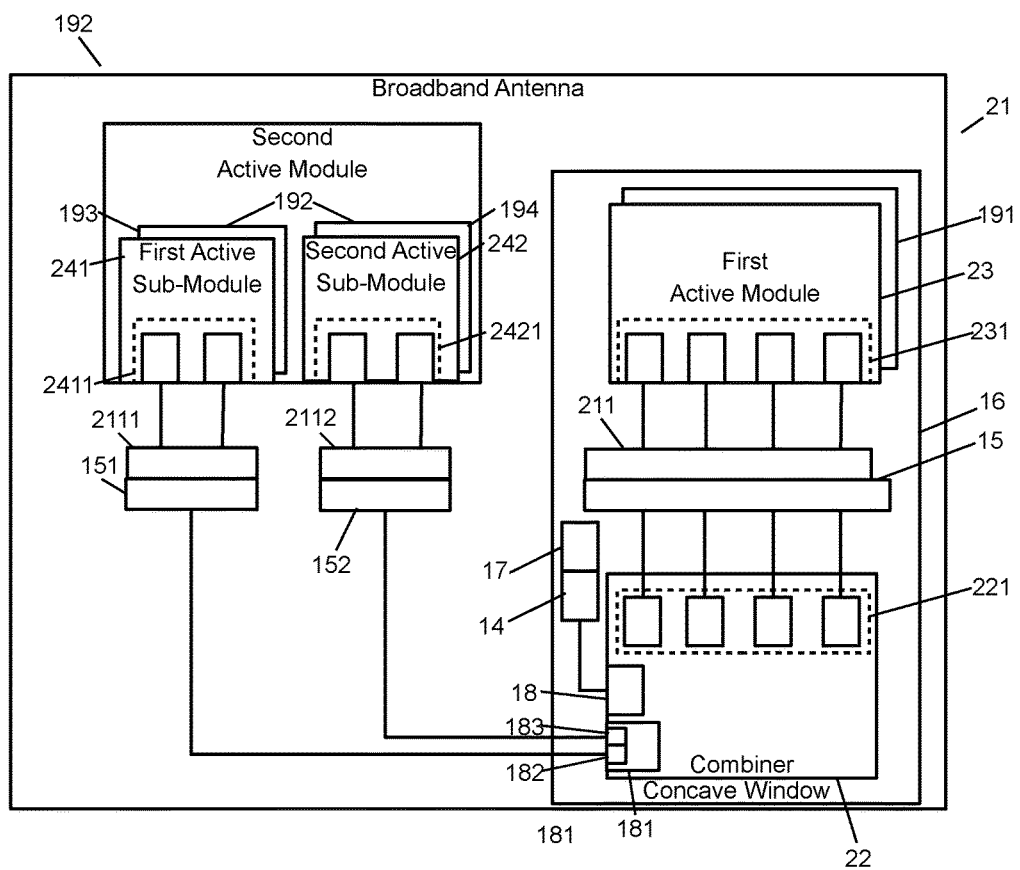
FIG. 3 is a schematic structural diagram of another multi-band active antenna according to an embodiment of the present invention.

As an optional implementation manner, as shown in FIG. 3, the second active module 24 may include: a first active sub-module 241 and a second active sub-module 242, where: the first active sub-module 241 is removably connected to a first sub-mounting kit 193 of the second mounting kit 192 disposed on the enclosure frame of the broadband antenna 21; a first port 2411 of the first active sub-module 241 is connected to a first group of antenna ports 2111 disposed on the external surface of the broadband antenna 21 by a conducting wire, where the first group of antenna ports 2111 is connected to a first intermediate port 151 disposed in the window 16 by a conducting wire, where the first intermediate port 151 is connected to a first sub-port 182 of the third port 181 of the combiner 22; and the second active sub-module 242 is removably connected to a second sub-mounting kit 194 of the second mounting kit 192 disposed on the enclosure frame of the broadband antenna 21; a first port 2421 of the second active sub-module 242 is connected to a second group of antenna ports 2112 disposed on the external surface of the broadband antenna 21 by a conducting wire, where the second group of antenna ports 2112 is connected to a second intermediate port 152 disposed in the window by a conducting wire, where the second intermediate port 152 is connected to a second sub-port 183 of the third port 181 of the combiner 22.

Optionally, as shown in FIG. 3, the window 16 may be disposed in an intermediate position of the rear side of the enclosure frame of the broadband antenna 21; and the first mounting kit 191 may be disposed in a lower position of the upper half part of the rear side of the enclosure frame. In this way, the first port 231 of the first active module 23 connected to the first mounting kit is easily connected to the second port 221 of the combiner 22. The first sub-mounting kit 193 may be disposed in the lower half part of the rear side of the enclosure frame, and the first group of antenna ports 2111 may be disposed at the bottom of the rear side of the enclosure frame. In this way, the first port 2411 of the first active sub-module 241 connected to the first sub-mounting kit 193 is easily connected to the first group of antenna ports 2111. The second sub-mounting kit 194 may be disposed in an upper position of the upper half part of the rear side of the enclosure frame, and the second group of antenna ports 2112 may be disposed at the upper end of the rear side of the enclosure frame. In this way, the first port 2421 of the second active sub-module 242 connected to the second sub-mounting kit 194 is easily connected to the second group of antenna ports 2112.

In this implementation manner, the sharing of an antenna system by three frequency bands is implemented.

Figure 4:
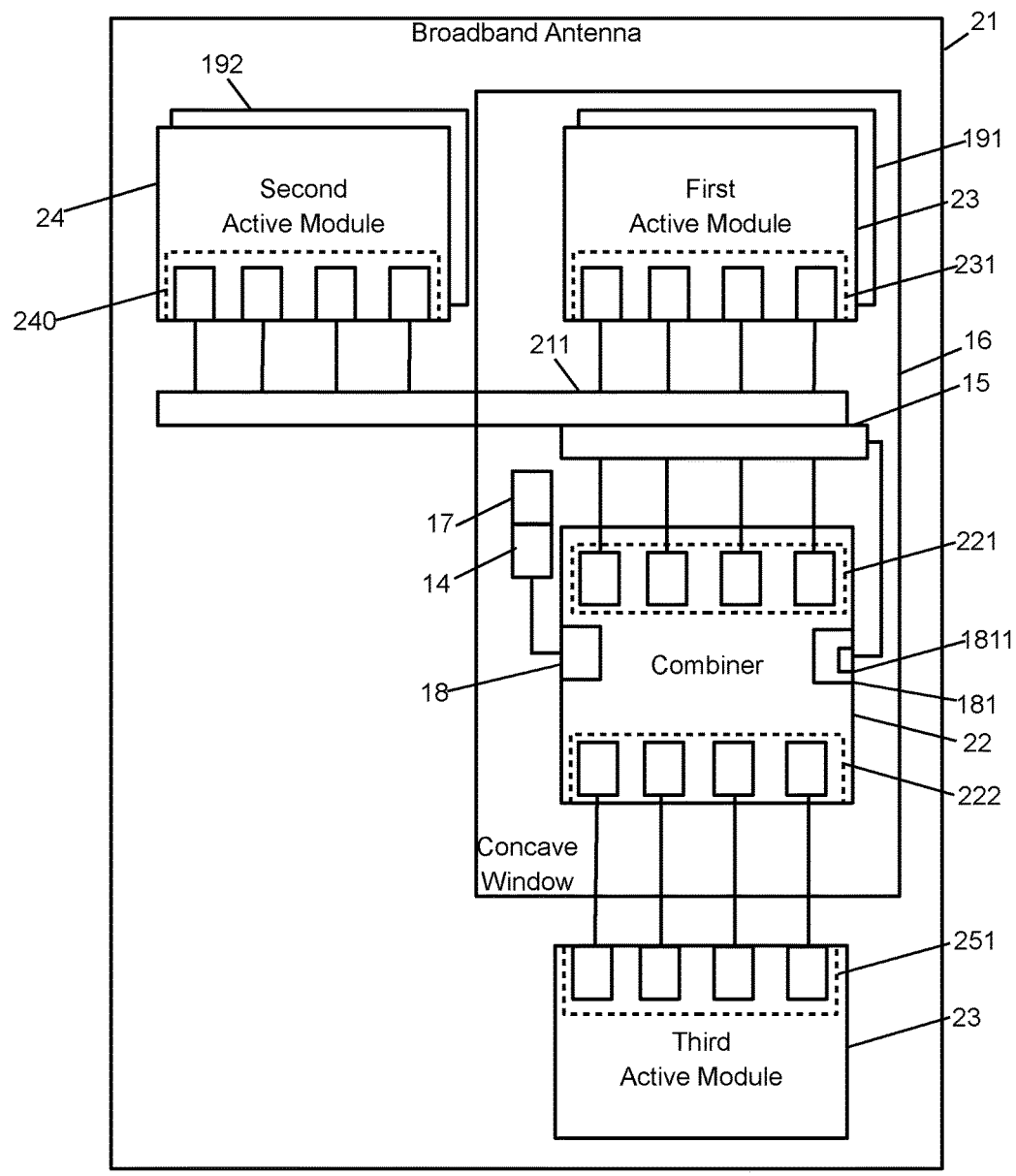
FIG. 4 is a schematic structural diagram of another multi-band active antenna according to an embodiment of the present invention.

As an optional implementation manner, as shown in FIG. 4, the multi-band active module may further include: a third active module 25, where: the third active module 25 is connected to a fourth port 222 of the combiner 22 by a conducting wire.

Optionally, this implementation manner can apply to a scenario where the enclosure frame of the broadband antenna has insufficient space to install multiple active modules, so that an active module can be disposed externally, for example, the third active module 25. When a site is deployed and installed, the third active module 25 may be fastened to a structure used to install a multi-band active antenna.

Optionally, like the first active module 23 and the second active module 24, there may be multiple third active modules 25.

Optionally, as shown in FIG. 4, the window 16 may be disposed in an intermediate position of the rear side of the enclosure frame of the broadband antenna 21; the first mounting kit 191 may be disposed in the upper half part of the rear side of the enclosure frame; and the second port 221 of the combiner 22 may be disposed in the upper half part of a front side of the combiner 22. In this way, the first port 231 of the first active module 23 connected to the first mounting kit is easily connected to the second port 221 of the combiner 22, The second mounting kit 192 may be disposed in the lower half part of the rear side of the enclosure frame, and the antenna port 211 may be disposed at the bottom of the rear side of the enclosure frame. In this way, the first port 240 of the second active module 24 connected to the second mounting kit is easily connected to the antenna port 211. The fourth port 222 of the combiner 22 may be disposed in the lower half part of the front side of the combiner 22. In this way, the first port 251 of the third active module 25 can be easily connected to the fourth port 222 of the combiner 22.

In this implementation manner, the sharing of an antenna system by three frequency bands is implemented.

As an optional implementation manner, the broadband antenna 21 may include any one of the following: a dual-array high-frequency antenna, a single-array high-frequency antenna, a single-array low-frequency antenna, and a multi-array antenna.

Optionally, the foregoing ports include the first port 18 and the second port 221 of the combiner 22 and the antenna port 211 and the intermediate port 15 of the broadband antenna 21. The interface quantities of these ports are the same as the interface quantity of the first port 17 of the broadband antenna. The broadband antennas 21 illustrated in FIG. 2, FIG. 3, and FIG. 4 are all dual-array high-frequency antennas. In this way, the interface quantities of these ports are all 4.

Figure 5:
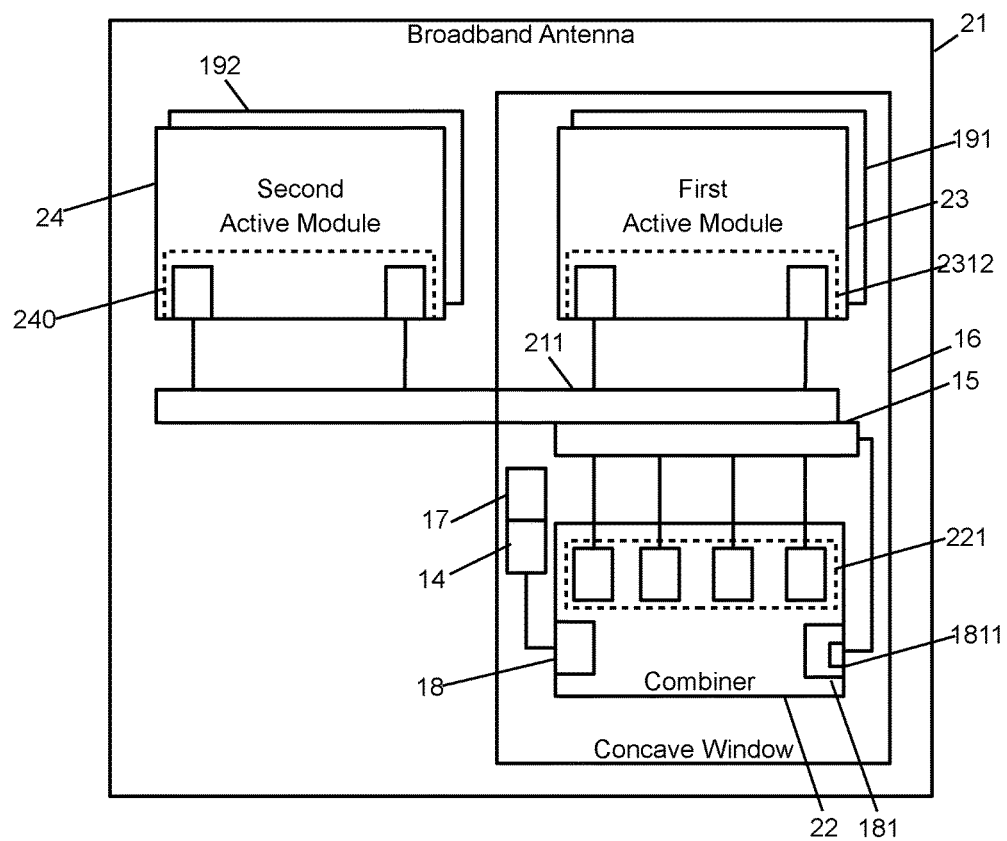
FIG. 5 is a schematic structural diagram of another multi-band active antenna according to an embodiment of the present invention.

When the broadband antenna 21 is a single-array high-frequency antenna, the interface quantity of the first port of the single-array high-frequency antenna is 2. As shown in FIG. 5, the interface quantities of these ports are 2. The interface quantity of the second port 221 of the combiner 22 is 2, the interface quantity of the antenna port 211 of the broadband antenna 21 is 2, the interface quantity of the first port 2312 of the first active module 23 is 2, and the interface quantity of the first port 240 of the second active module 24 is 2. Assuredly, the interface quantities of the intermediate port 15, the third port 181 of the combiner 22, and the first port 18 of the combiner 22 are all 2. Similarly, the interface quantities of these ports can be obtained when the broadband antenna 21 is a single-array low-frequency antenna or a multi-array antenna, which is not further detailed herein.

As an optional implementation manner, the first port 18 of the combiner 22 is connected to the input port of the broadband antenna 21 in blind-mate connection mode.

Optionally, when the broadband antenna 21 is a dual-array high-frequency antenna, both the first port 18 of the combiner 22 and the first port 17 of the broadband antenna 21 have four interfaces; and positions where the first port 18 of the combiner 22 and the first port 17 of the broadband antenna 21 are disposed have already been described above, that is, the first port 18 of the combiner 22 may be disposed on the rear side of the combiner 22, and the first port 17 of the broadband antenna 21 may be disposed in a position that is inside the window 16 and matches the first port of the combiner 22, while the first port of the combiner 22 is connected to the first port of the broadband antenna 21 in blind-mate connection mode. In this way, so long as the combiner 22 is inserted into the window, the first port of the combiner 22 is connected to the first port of the broadband antenna 21.

As an optional implementation manner, the first port 18 of the combiner 22 is connected to the first port 17 of the broadband antenna 21 by a cable; or the first port 18 of the combiner 22 is connected to the first port 17 of the broadband antenna 21 by a conducting wire.

As an optional implementation manner, the intermediate port 15 of the broadband antenna 21 is connected to the third port 181 of the combiner 22 in blind-mate connection mode.

Optionally, when the broadband antenna 21 is a dual-array high-frequency antenna, both the third port 181 of the combiner 22 and the input port 14 of the broadband antenna 21 have four interfaces; and positions where the third port 181 of the combiner 22 and the intermediate port 15 of the broadband antenna 21 are disposed have already been described above, that is, the third port 181 of the combiner 22 may be disposed on the rear side of the combiner 22, and the intermediate port 15 of the broadband antenna 21 may be disposed in a position that is inside the window 16 and matches the third port of the combiner 22, while the intermediate port 15 of the broadband antenna 21 is connected to the third port 181 of the combiner 22 in blind-mate connection mode. In this way, so long as the combiner 22 is inserted into the window, the third port of the combiner 22 is connected to the intermediate port of the broadband antenna 21.

As an optional implementation manner, the intermediate port 15 of the broadband antenna 21 is connected to the third port 181 of the combiner 22 by a cable.

It should be noted that all the ports described in the embodiments of the present invention are bidirectional ports, that is, these ports may be configured to receive data and may also be configured to transmit data.

In the foregoing technical solution, multiple implementation manners of the multi-band active antenna have been detailed above on the basis of the foregoing embodiments, which can reduce occupied site installation space and facilitate site installation.

The foregoing descriptions are merely exemplary embodiments of the present invention, but are not intended to limit the present invention. Any equivalent modifications made in accordance with the claims of the present invention shall still fall in the scope of the present invention.

What is claimed is:

1. A multi-band active antenna, the multi-band active antenna comprising
a broadband antenna, wherein a concave window is disposed on an enclosure frame of the broadband antenna, and a first port of the broadband antenna is disposed in the window;
a combiner removably plug-connected into the window, and a first port of the combiner is electrically connected to the first port of the broadband antenna;
an active module, wherein a first port of the active module is electrically connected to a second port of the combiner, and wherein the combiner is configured to synthesize signals of multiple frequency bands respectively amplified by multiple active modules into a synthesized signal, and to send synthesized signal to the broadband antenna; and
a mounting kit disposed on the enclosure frame of the broadband antenna, wherein the active module is removably connected to the mounting kit.

2. The multi-band active antenna according to claim 1, wherein an antenna port of the broadband antenna is disposed on an external surface of the broadband antenna;
   wherein the first port of the active module is electrically connected to the antenna port; and
   wherein an intermediate port connected to the antenna port is disposed in the window, where the intermediate port is electrically connected to the second port of the combiner.

3. The multi-band active antenna according to claim 1, wherein the active module comprises a first active module and a second active module;
   wherein the first active module is removably connected to a first mounting kit disposed on the enclosure frame of the broadband antenna;
   wherein the second active module is removably connected to a second mounting kit disposed on the enclosure frame of the broadband antenna;
   wherein a first port of the first active module is electrically connected to the second port of the combiner; and
   wherein a first port of the second active module is connected to an antenna port disposed on an external surface of the broadband antenna by a second conducting wire, wherein the antenna port is electrically connected to an intermediate port disposed in the window, and wherein the intermediate port is electrically connected to a third port of the combiner.

4. The multi-band active antenna according to claim 3, wherein the second active module comprises at least one active sub-module;
   wherein the second mounting kit disposed on the enclosure frame of the broadband antenna comprises at least one sub-mounting kit;
   wherein the antenna port disposed on the external surface of the broadband antenna comprises at least one group of antenna ports;
   wherein the intermediate port disposed in the window comprises at least one intermediate port;
   wherein the third port of the combiner comprises at least one input sub-port;
   wherein the at least one active sub-module is installed on the at least one sub-mounting kit in a one-to-one manner;
   wherein a first port of the at least one active sub-module is electrically connected to the at least one group of antenna ports in a one-to-one manner;
   wherein the at least one group of antenna ports is electrically connected to the at least one intermediate port in a one-to-one manner; and
   wherein the at least one intermediate port is connected to the at least one input sub-port in a one-to-one manner.

5. The multi-band active antenna according to claim 3, wherein the second active module comprises a first active sub-module and a second active sub-module;
   wherein the first active sub-module is removably connected to a first sub-mounting kit of the second mounting kit disposed on the enclosure frame of the broadband antenna;
   wherein a first port of the first active sub-module is electrically connected to a first group of antenna ports disposed on the external surface of the broadband antenna, wherein the first group of antenna ports is electrically connected to a first intermediate port disposed in the window, wherein the first intermediate port is connected to a first sub-port of the third port of the combiner;
   wherein the second active sub-module is removably connected to a second sub-mounting kit of the second mounting kit disposed on the enclosure frame of the broadband antenna; and
   wherein a first port of the second active sub-module is electrically connected to a second group of antenna ports disposed on the external surface of the broadband antenna, wherein the second group of antenna ports is electrically connected to a second intermediate port disposed in the window, and wherein the second intermediate port is electrically connected to a second sub-port of the third port of the combiner.

6. The multi-band active antenna according to claim 5, wherein the window is disposed in an intermediate position of the enclosure frame, the first mounting kit and the second sub-mounting kit are separately disposed in an upper half part of the enclosure frame and the first sub-mounting kit is disposed in a lower half part of the enclosure frame.

7. The multi-band active antenna according to claim 3, wherein the multi-band active antenna further comprises a third active module, and wherein a first port of the third active module is electrically connected to a fourth port of the combiner.

8. The multi-band active antenna according to claim 7, wherein the window is disposed in an intermediate position of the enclosure frame, the first mounting kit is disposed in an upper half part of the enclosure frame and the second mounting kit is disposed in a lower half part of the enclosure frame.

9. The multi-band active antenna according to claim 3, wherein the intermediate port is connected to the third port of the combiner by a blind-mate connection mode or by a cable.

10. The multi-band active antenna according to claim 1, wherein the first port of the combiner is connected to one of a second port of the broadband antenna in blind-mate connection mode or the first port of the broadband antenna by a cable.

* * * * *